(12) United States Patent
Steele et al.

(10) Patent No.: US 11,064,573 B2
(45) Date of Patent: Jul. 13, 2021

(54) DETERMINING RESONANT FREQUENCY FOR QUASI-RESONANT INDUCTION COOKING DEVICES

(71) Applicant: Haier US Appliance Solutions, Inc., Wilmington, DE (US)

(72) Inventors: Victoria Steele, Louisville, KY (US); Meher P. Kollipara, Louisville, KY (US); Isaac Nam, Louisville, KY (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 813 days.

(21) Appl. No.: 15/657,304

(22) Filed: Jul. 24, 2017

(65) Prior Publication Data

US 2019/0029078 A1 Jan. 24, 2019

(51) Int. Cl.
*H05B 6/06* (2006.01)
*H02M 5/458* (2006.01)
*G01R 23/02* (2006.01)
*H02M 7/48* (2007.01)

(52) U.S. Cl.
CPC .............. *H05B 6/062* (2013.01); *G01R 23/02* (2013.01); *H02M 5/4585* (2013.01); *H02M 2007/4815* (2013.01)

(58) Field of Classification Search
CPC ...... H05B 6/062; H05B 6/065; H05B 6/1272; H05B 6/1236; H05B 6/66; H05B 2213/07; H05B 6/04; H05B 2213/05; H05B 2213/03; H05B 1/0263; H05B 1/0266; H05B 3/12; H05B 41/2822; H05B 41/3921; H05B 45/00; H05B 45/10; H05B 45/37; G01R 23/02; H02M 5/4585; H02M 2007/4815; H02M 5/458; H02M 1/4225; H02M 2001/007; H02M 3/3155; H02M 3/3387; H02M 5/27; H02M 5/45; H02M 7/48;

(Continued)

(56) References Cited

U.S. PATENT DOCUMENTS 4,112,287 A * 9/1978 Oates ...................... H02M 5/27
219/626
4,356,371 A * 10/1982 Kiuchi ................... H05B 6/062
219/626

(Continued)

FOREIGN PATENT DOCUMENTS

EP 1629698 B1 12/2006

OTHER PUBLICATIONS

Ovidiu, Analysis and Simulation of Quasi-Resonant Inverter for induction Heating Applications, 2014 (Year: 2014).*

*Primary Examiner* — Christopher M Koehler
*Assistant Examiner* — Chris Q Liu
(74) *Attorney, Agent, or Firm* — Dority & Manning, P.A.

(57) ABSTRACT

Systems and methods of quasi-resonant induction heating are provided. In particular, a method for evaluating the resonant frequency of a quasi-resonant induction cooking device can be provided. The method can include generating a startup pulse, receiving multiple feedback pulses from a resonant frequency feedback circuit, measuring a pulse width of each of the feedback pulses, calculating an average pulse width based upon the feedback pulses and determining the resonant frequency based at least in part on the average pulse width and a transfer function.

7 Claims, 5 Drawing Sheets

(58) Field of Classification Search
CPC .... H02M 7/515; H02M 7/523; H02M 7/5236; H02M 7/537
USPC ....... 219/626, 665, 660, 661, 490, 497, 650, 219/664, 670, 672, 702, 715, 600, 620, 219/625, 662, 663, 667, 621, 627, 668, 219/498, 622, 624, 630, 674, 716
See application file for complete search history.

(56) References Cited

U.S. PATENT DOCUMENTS

| | | | | |
|---|---|---|---|---|
| 4,805,081 | A * | 2/1989 | Chambers | H02M 3/3155 363/96 |
| 9,006,624 | B2 | 4/2015 | Brosnan et al. | |
| 2003/0195969 | A1* | 10/2003 | Neuman | H04N 21/6587 709/229 |
| 2009/0294434 | A1* | 12/2009 | Fonseca | H05B 1/0263 219/498 |
| 2012/0187107 | A1* | 7/2012 | Liu | H02M 5/458 219/492 |
| 2012/0285948 | A1* | 11/2012 | Shan | H05B 6/062 219/660 |
| 2013/0334212 | A1* | 12/2013 | Sawada | H02M 5/458 219/662 |
| 2015/0137863 | A1* | 5/2015 | Rehm | H02M 3/3387 327/156 |
| 2016/0149440 | A1* | 5/2016 | Staring | H02J 50/10 307/104 |

* cited by examiner

DETERMINING RESONANT FREQUENCY FOR QUASI-RESONANT INDUCTION COOKING DEVICES

FIELD

The present disclosure relates generally to induction cooking devices and systems and methods for operating induction cookers.

BACKGROUND

Induction cooking appliances are more efficient, have greater temperature control precision and provide more uniform cooking than other conventional cooking appliances. In conventional cooktop systems, an electric or gas heat source is used to heat cookware in contact with the heat source. This type of cooking can be inefficient because only the portion of the cookware in contact with the heat source is directly heated. The rest of the cookware is heated through conduction that causes non-uniform cooking throughout the cookware. Heating through conduction takes an extended period of time to reach a desired temperature.

In contrast, induction cooking systems heat cookware by magnetic induction. Induction cooking systems typically include a coil positioned beneath a cooking surface on which the cookware item rests. In operation, an electric current flows through the coil such that the coil emits a magnetic field. The magnetic field induces a magnetic flux which repeatedly magnetizes the cookware item. The magnetic flux produces eddy currents within the ferromagnetic material that comprises the cookware item. The eddy currents heat the cookware item and a food item contained therein.

Induction cookers also typically include a control panel having a display and one or more buttons. Through the use of the buttons, a user may manually select/adjust one or more cooking parameters, such as a cook time or a heating level. However, an optimal cook time can vary depending upon numerous factors, such as weight of the cookware and the food item therein. Selection of a cook time and/or heating level that is less than optimal may result in the food item being undercooked or overcooked.

Quasi-resonant induction cooking devices use one or more switching elements which can be switched on and off at certain times. To determine the times at which the switching elements should be turned on and off, the resonant frequency of a tank circuit, created by a parallel configuration of an inductor, a capacitor and the cooking vessel can be determined. To properly drive an induction cooking device, it is important to have an accurate assessment of the resonant frequency of the tank circuit. Operating induction cooking devices at the proper frequency, such as at, or slightly above the resonant frequency, can be advantageous for a number of reasons. Some of the reasons include, for example, achieving maximum power transfer between the induction heating coil and the cooking vessel (i.e., to produce more efficient operation of the induction cooking system). Operating induction cooking devices at an improper frequency can result in damage to the device. For example, operation at an improper frequency can result in greater switching losses that can lead to reduced efficiency as well as entering into human audible hearing range. Operation at an improper frequency can also place stress on the switching elements which can increase the likelihood of damage to the switching elements during operation of the quasi-resonant induction cooking device.

Accordingly, an induction cooker with features for determining and monitoring resonant frequency would be useful and welcomed. Additionally, systems and methods for determining and monitoring resonant frequency would be useful and welcomed.

BRIEF DESCRIPTION

Aspects and advantages of embodiments of the present disclosure will be set forth in part in the following description, or may be learned from the description, or may be learned through practice of the embodiments.

One example aspect of the present disclosure is directed to a method for determining a resonant frequency of a quasi-resonant inverter in an induction cooking device. The quasi-resonant inverter includes a parallel configuration of an inductor, a capacitor, a cooking vessel, a switching element and a resonant frequency feedback circuit. The method can include generating, by one or more controllers, a startup pulse and receiving, by one or more controllers, multiple feedback pulses from a resonant frequency feedback circuit. The method can further include measuring a pulse width of each of the feedback pulses and calculating a sync pulse width based upon the feedback pulses. The method can also include determining the resonant frequency based at least in part on the sync pulse width and a transfer function.

Another example aspect of the present disclosure is directed to a control system for operating an induction cooking device based on a resonant frequency of a quasi-resonant inverter in the induction cooking device. The control system can include one or more processors and one or more memory devices. The one or more memory devices can be configured to store instructions that when executed by the one or more processors cause the cause the one or more processors to perform operations. The operations can include receiving a user input indicative of a desired operating power level of the induction cooking device, generating a startup pulse and operating a switching element based at least in part on the start pulse. The operations can also include receiving multiple feedback pulses from a resonant frequency feedback circuit and measuring a pulse width of each of the feedback pulses. The operations can further include determining the resonant frequency based at least in part on the pulse width of the feedback pulses and a transfer function, causing the switching element to turn off based at least in part on the resonant frequency and causing the switching element to turn on based at least in part on the user input.

Another example aspect of the present disclosure is directed to an induction cooking device. The induction cooking device includes a power source, a resonant frequency feedback circuit, a gate driver and a quasi-resonant inverter. The quasi-resonant inverter can include an induction heating coil configured to inductively heat a load with a magnetic field, a capacitor coupled to the induction heating coil, a switching element and one or more control devices. The one or more control devices configured to perform operations including generating a startup pulse, operating a switching element based at least in part on the start pulse and receiving multiple feedback pulses from the resonant frequency feedback circuit. The operations can also include determining if the number of feedback pulses received is within a first predetermined range, measuring a pulse width of each of the feedback pulses and determining whether the pulse width of each of the feedback pulses is within a second predetermined range. The operations can further include calculating a pulse width based upon the feedback pulses that are within the first predetermined range and the second predetermined range, determining the resonant frequency based at least in part on the pulse width and a transfer function, causing the gate driver to turn off the switching element based at least in part on the resonant frequency and causing the gate driver to turn on the switching element based at least in part on the user input.

Variations and modifications can be made to these example aspects of the present disclosure. These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
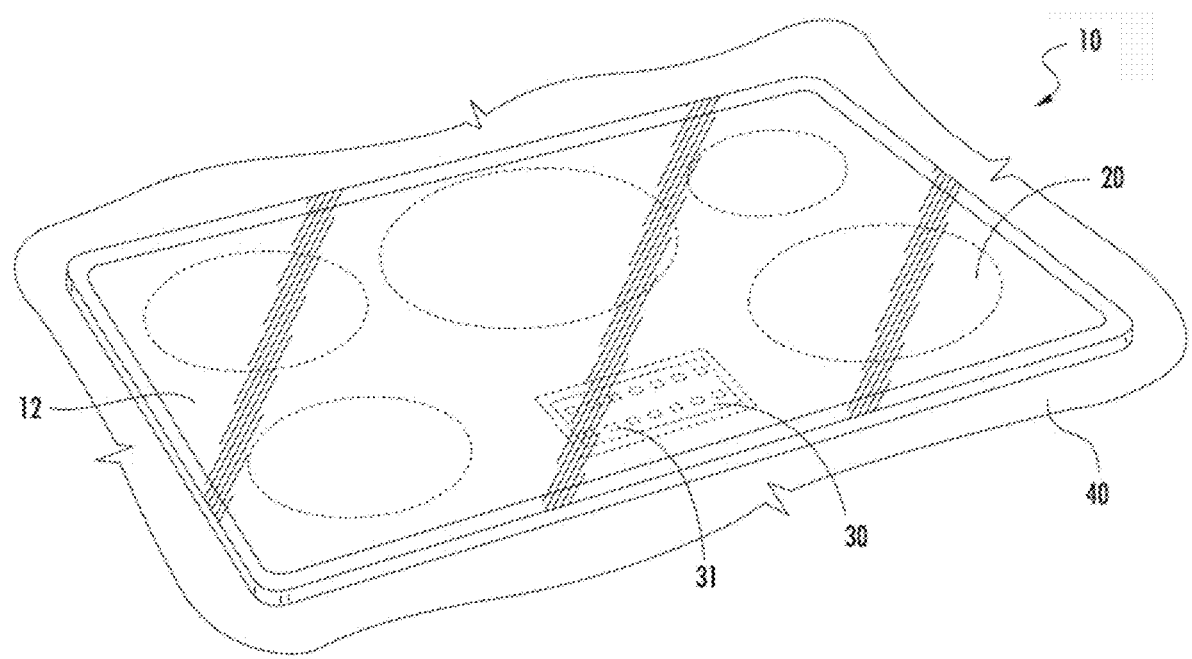
FIG. 1 depicts an example induction cooktop appliance according to example embodiments of the present disclosure.

Reference now will be made in detail to embodiments of the disclosure, one or more examples of which are illustrated in the drawings. Each example is provided by way of explanation of the disclosure, not limitation of the disclosure. In fact, it will be apparent to those skilled in the art that various modifications and variations can be made in the present disclosure without departing from the scope or spirit of the disclosure. For instance, features illustrated or described as part of one embodiment can be used with another embodiment to yield a still further embodiment. Thus, it is intended that the present disclosure covers such modifications and variations as come within the scope of the appended claims and their equivalents.

Example aspects of the present disclosure are directed to quasi-resonant (QR) induction cooking devices. When operating QR cooking devices, it can be beneficial for QR inverters to operate with zero-voltage switching (ZVS). For QR inverter topology in induction cooking devices, effective load can vary due to different types of pans and pots placed on the cooktop. One of the challenges can be to determine the duration in which the switching elements of the induction cooking device should turn on and turn off so that ZVS can occur. In order to turn the switching elements on and off at the appropriate times so that ZVS can occur, the resonant frequency of the tank circuit (created by a parallel configuration of an inductor, a capacitor and a cooking vessel) can be determined. Determining resonant frequency is important for properly turning on and off the switching element of a QR inverter without incurring damage to the switching elements. As such, systems and methods for accurately determining resonant frequency of a QR inverter are advantageous with regard to the operation of QR induction cooking device.

According to example embodiments of the present disclosure, the resonant frequency of a tank circuit can be determined and/or monitored to set the appropriate off-time of a gate driver that is driving the switching element of the QR induction cooking device. The on-time of the gate driver is set as based on the user selected power level for the QR induction cooking device. The off-time of the gate driver is based upon, and is in itself, a measurement of the resonant frequency of the tank circuit. Resonant frequency is determined and monitored using one or more controllers which measure and process a pulse width generated by hardware within the QR induction cooking device. For instance, the resonant frequency can be determined by measuring a pulse generated by a resonant frequency feedback circuit (e.g., a comparator circuit) which is obtained by measuring voltage across the collector-emitter junction ($V_{CE}$) of the switching element. The comparator circuit generates an output signal (e.g., a pulse) based, at least in part, on the voltage at the system bus ($V_{BUS}$) and the voltage that is measured across the collector-emitter junction ($V_{CE}$) of the switching element. The width of the pulse generated by the comparator circuit is measured by the one or more controllers.

The one or more controllers apply a transfer function to the pulse generated by the comparator circuit to determine a sync signal, which is equivalent to or nearly equivalent to the resonant frequency of the resonant tank circuit. The sync signal is the amount of time the switching element should be turned off by the gate driver (i.e., the "off-time" of the switching element). The transfer function is based upon the amount of time required for the pulse generated by the comparator circuit, which is a pulse width modulation signal, to increase from zero volts to the voltage at the system bus ($V_{BUS}$) and to decrease from the voltage at the system bus ($V_{BUS}$) to zero volts. The one or more controllers then provide the sync signal to the gate driver for driving the switching element and generating heat within the cooking vessel.

Determining and monitoring the resonant frequency by measuring a pulse width generated by a resonant frequency feedback circuit (e.g., a voltage comparator circuit) provides accurate and tunable feedback for driving the switching element of the QR inverter. In this way, example aspects of the present disclosure can provide a number of technical effects and benefits. For instance, example aspects of the present disclosure can precisely control the turning on and turning off of the switching element (e.g., an IGBT) such that these switching functions occur at zero voltage or near zero voltage conditions. Operating switching elements of a QR inverter at zero voltage or near zero voltage conditions reduces electromagnetic interference (EMI), conduction losses and switching losses through the switching element.

Referring now to the figures, example aspects of the present disclosure will be discussed in greater detail.

FIG. 1 depicts induction cooktop 10 according to example embodiments of the present disclosure. Cooktop 10 can be installed in chassis 40 and in various configurations such as cabinetry in a kitchen, coupled with one or more ovens or as a stand-alone appliance. Chassis 40 can be grounded. Cooktop 10 includes a horizontal surface 12 that can be glass or other suitable material. Induction coil 20 can be provided below horizontal surface 12. It can be understood that cooktop 10 can include a single induction coil or a plurality of induction coils.

Cooktop 10 is provided by way of example only. The present disclosure can be used with other configurations. For example, a cooktop having one or more induction coils in combination with one or more electric or gas burner assemblies. In addition, the present disclosure can be used with a cooktop having a different number and/or positions of burners.

Cooktop 10 can include a user interface 30. User interface 30 can have various configurations and controls can be mounted in other configurations and locations other than as shown in the embodiment. In the illustrated embodiment, the user interface 30 can be located within a portion of the horizontal surface 12, as shown. Alternatively, the user interface can be positioned on a vertical surface near a front side of the cooktop 10 or other suitable location. The user interface 30 can include an input component 31. Input component 31 can be, for instance, a capacitive touch screen. The input component 31 can allow for the selective activation, adjustment or control of any or all induction coils 20 as well as any timer features or other user adjustable inputs. One or more of a variety of electrical, mechanical or electro-mechanical input devices, including rotary dials, push buttons, and touch pads, can also be used singularly or in combination as input component 31. The user interface 30 can include a display component, such as a digital or analog display device designed to provide operation feedback to a user.

Figure 2:
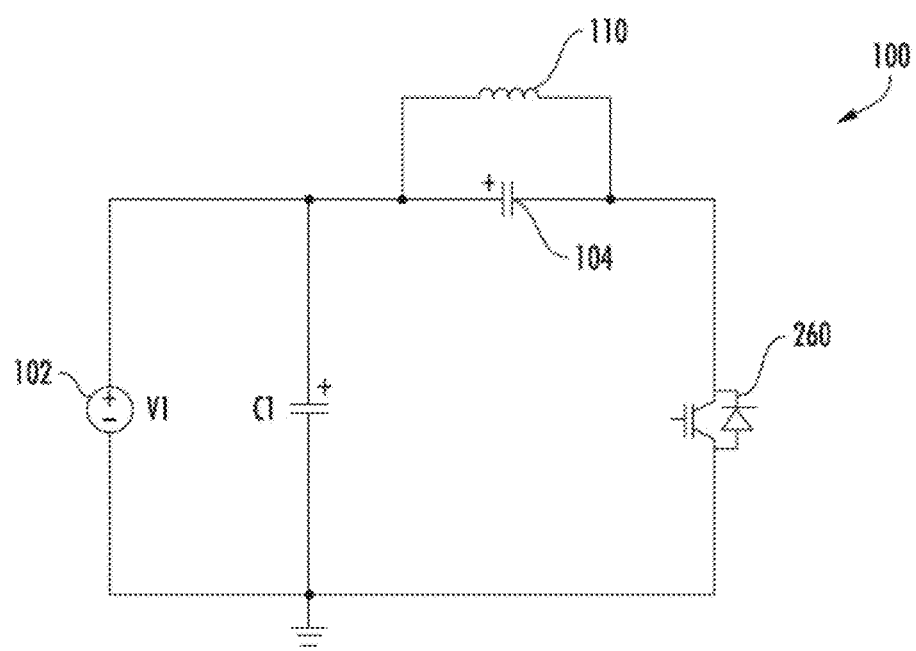
FIG. 2 depicts a circuit diagram of an example quasi-resonant inverter for use in an induction heating system according to example embodiments of the present disclosure.

FIG. 2 depicts a circuit diagram of quasi-resonant inverter 100 for use in an induction heating system according to example embodiments of the present disclosure. Inverter 100 can include induction coil 110 and resonant capacitor 104. In particular, induction heating coil 110 and resonant capacitor 104 can correspond to a resonant tank circuit. Induction coil 110 can be configured to receive power signals from rectified alternating current (AC) source 102. Alternatively, any other power source can be used. For instance, the source for the inverter 100 can be a single phase power supply, a three phase power supply, a generator, a battery, and/or any direct current (DC) power source.

When a power signal is provided to induction coil 110, a varying or alternating magnetic field can be produced in induction coil 110. Induction coil 110 can include any configuration or material capable of creating a magnetic field that can produce eddy currents within a cookware utensil. For instance, induction coil 110 can include windings in horizontal direction, a vertical direction, or a combination of horizontal and vertical direction. Magnetic core materials such as but not limited to ferrite can be placed near induction coil 110.

Inverter 100 further includes switching element 260. Switching element 260 can be IGBT, MOSFET, BJT, or any other suitable switching element. It will be appreciated that inverter 100 can include more than one switching element. In an implementation, switching element 260 can be an IGBT with a diode connected in anti-parallel configuration.

Switching element 260 can control operation of the inverter such that current through induction coil 110 is controlled to have different shapes at different frequencies and different magnitudes. In particular, switching element 260 can receive control commands from one or more control devices, such as one or more gate drivers or other control devices. For instance, control commands can be determined based at least in part on one or more switching control signals provided from a control device. In some implementations, switching element 260 can receive control signals from an independent control device. The control signals can cause switching element 260 to turn on or off during one or more time periods, such that induction heating coil 110 produces a desired amount of output power. In some implementations, switching element 260 can be turned on and off in a manner such that inverter 100 is operated at a desired operating frequency.

Inverter 100 can be controlled to operate in a plurality of charging phases wherein induction heating coil 110 stores energy, and in a plurality of resonant phases wherein energy stored during the previous charging phases oscillates between induction heating coil 110 and resonant capacitor 104 to generate an alternating current signal. The charging phases can approximately correspond to the timer periods wherein the switching element is turned on. The resonant phases can approximately correspond to the periods of time wherein the switching element is turned off. In this manner, inverter 100 can be controlled such that current flows through switching element 260 during a first subset of charging phases, and not during a second subset of charging phases.

For instance, during a first charging phase of inverter 100, switching element 260 can be turned on (e.g., by applying sufficient gate voltage to switching element 260) during a first time period to allow induction heating coil 110 to charge to a sufficient level. Switching element 260 can then be turned off to allow the energy stored in induction heating coil 110 during the first charging phase to oscillate (e.g., during a first resonant phase of inverter 100) between induction heating coil 110 and resonant capacitor 104, such that an alternating current signal is produced. During the switch-off duration, the alternating current signal can cause sinusoidal voltage oscillation across switching element 260 such that the voltage oscillation is underdamped enough to reach zero.

Figure 3:
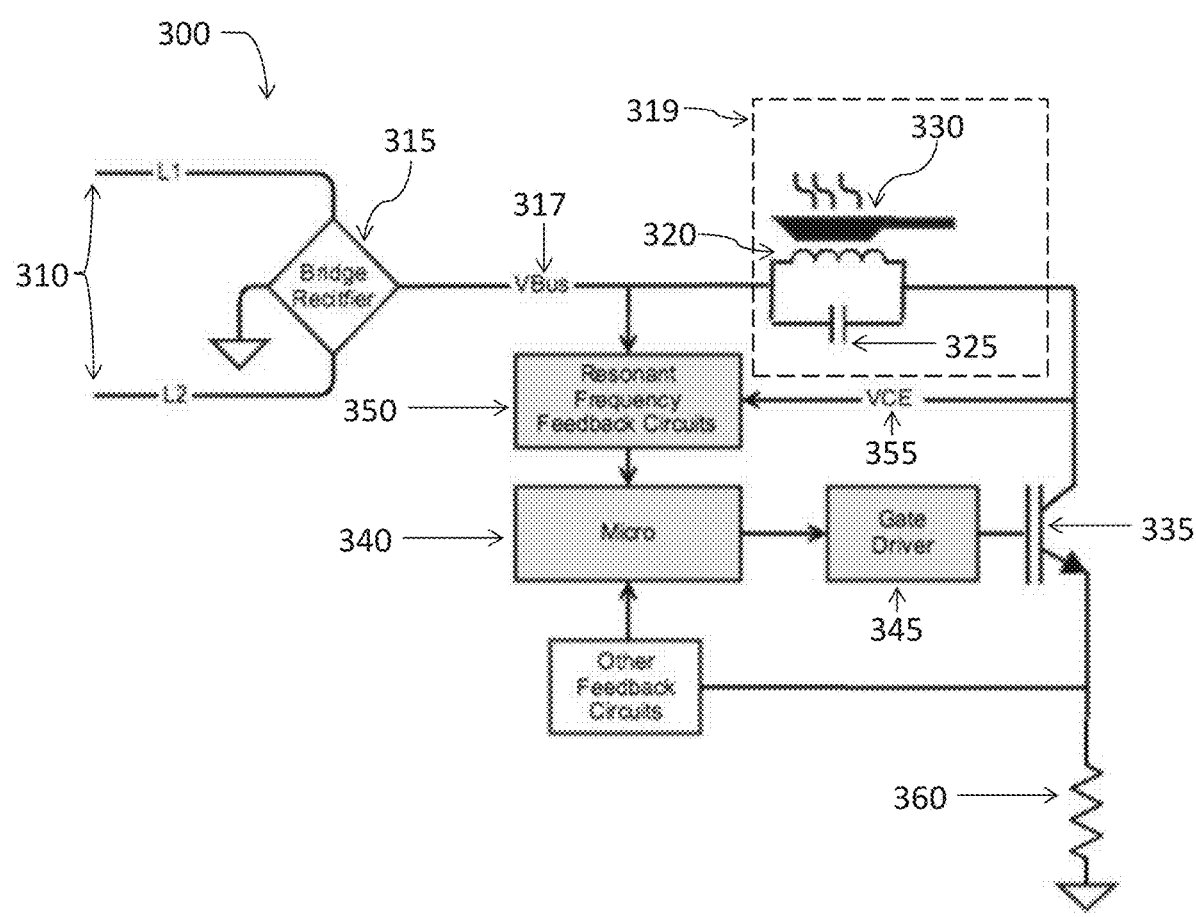
FIG. 3 depicts a block diagram of an induction cooking system according to example embodiments of the present disclosure.

FIG. 3 depicts a block diagram of an induction cooking system 300 according to example embodiments of the present disclosure. Induction cooking system 300 includes a power supply 310 and a rectifier 315. Rectifier 315 is coupled between power supply 310. When an AC power supply signal is provided at power supply 310, rectifier 315 can convert the AC power signal into direct current (DC) signal. This signal is supplied to the other components of induction cooking system 300 via a system bus 317. Rectifier 315 can include various configurations and devices, such as diode bridge rectifier having a pair of AC input terminals and DC output terminals. The AC input terminals of the diode bridge rectifiers can be connected to single phase AC supply, such as power supply 310. It will be appreciated that any suitable rectifier can be included as rectifier 315 without deviating from the scope of the present disclosure.

Induction cooking system 300 includes controller 340 which may generally include one or more processor(s) and associated memory configured to perform a variety of computer-implemented functions (e.g., performing the methods, steps, calculations and the like disclosed herein). By way of example, any/all of the "control devices" or "controllers" discussed in this disclosure can include a memory and one or more processing devices such as microprocessors, CPUs or the like, such as general or special purpose microprocessors operable to execute programming instructions or micro-control code associated with operation of an induction cooktop appliance 10. The memory can represent random access memory such as DRAM, or read only memory such as ROM or FLASH. In one embodiment, the processor executes programming instructions stored in memory. The memory can be a separate component from the processor or can be included onboard within the processor. As used herein, the term "processor" refers not only to integrated circuits referred to in the art as being included in a computer, but also refers to a controller, microcontroller, a microcomputer, a programmable logic controller (PLC), an application specific integrated circuit (ASIC), and other programmable circuits. Additionally, the memory may generally include memory element(s) including, but not limited to, a computer readable medium (e.g., random access memory (RAM)), computer readable non-volatile medium (e.g., flash memory) and/or other suitable memory elements.

Induction cooking system 300 includes a tank circuit 319, which is created by a parallel configuration of an inductor 320, a capacitor 325, and a cooking vessel 330. Tank circuit 319 can be used to convert the signal provided via the system bus 317 into a high-frequency, high power signal in the induction coil to create induction heating used for cooking. Tank circuit 319 can be employed in a variety of inverter configurations. Tank circuit 319 can act as an oscillator to generate an alternating current signal. Induction cooking system 300 can include a switching element 335. Switching element 335 can be a single transistor such as an Insulated Gate Bipolar Transistor (IGBT). Switching element 335 can be coupled in series with tank circuit 319. Switching element 335 can be controlled to achieve a desired power output and/or operating frequency of the inverter. Switching element 335 can receive control commands from a gate driver 345 or other suitable control devices. For instance, the control commands provided by gate driver 345 can be determined based at least in part on one or more switching control signals provided from controller 340 to gate driver 345. The one or more switching control signals from controller 340 can be based at least in part on the resonant frequency of the tank circuit 319. The resonant frequency of the tank circuit 319 can be determined and monitored based, at least in part, on one or more resonant frequency feedback circuits 350. Resonant frequency feedback circuit 350 can include a voltage comparator circuit, which generates an output signal (e.g., a measured pulse width) based at least in part on the voltage at the system bus 317 ($V_{BUS}$) and the voltage that measured across the collector-emitter junction 355 ($V_{CE}$) of the switching element 335. The measured voltage across the collector-emitter junction 355 ($V_{CE}$) oscillates in a sinusoidal manner from zero volts to peak voltage and returns to zero volts, during each sinusoidal oscillation $V_{CE}$ is equivalent to the line voltage (i.e., $V_{BUS}$) at two points. The measured pulse width is based on the amount of time required for the voltage measured across the collector-emitter junction 355 ($V_{CE}$) to cross back and forth across the line voltage (i.e., the voltage at the system bus 317 ($V_{BUS}$)).

The pulse generated by the resonant frequency feedback circuit 350 is provided to and processed by the controller 340. The controller 340 determines the off-time of the switching element 335 based at least in part on the output signal of the resonant frequency feedback circuit 350 and generates a control signal associated with off-time (i.e., a sync signal) of the switching element 335, which is provided to the gate driver 345. Controller 340 can provide control signals to the gate driver 345 which can cause switching element 335 to turn on or off during one or more time periods, such that induction heating coil 320 produces a desired amount of output power.

More specifically, the control signal corresponding to the on-time of the switching element 355 and supplied by controller 340 to gate driver 345, is based on the user selected power level for the QR induction cooking device. The off-time of the switching element 355 and supplied by controller 340 to gate driver 345, is based upon, and is in itself, a measurement of the resonant frequency of the tank circuit 319. Resonant frequency is determined and monitored using controller 340 and measuring the width of the pulse generated by a resonant frequency feedback circuit 350 (e.g., a comparator circuit). Circuit 350 generates an output signal (e.g., a pulse) based at least in part on a comparison of the voltage at the system bus 317 ($V_{BUS}$) and the voltage that is measured across the collector-emitter junction 355 ($V_{CE}$) of the switching element 335. The width of the pulse generated by the circuit 350 is measured by the controller 340. The controller 340 applies a transfer function to the pulse generated by the circuit 350 to determine a sync signal, which is equivalent to or nearly equivalent to the resonant frequency of the tank circuit 319, is the amount of time the switching element 335 should be turned off by the gate driver 345 and therefore, causes the on-time of the switching element 355 to occur at ZVS or near ZVS. The transfer function is based upon the amount of time required for the voltage across the collector-emitter junction 355 ($V_{CE}$), which oscillates in a sinusoidal manner, to increase from zero volts to the line voltage at the system bus 317 ($V_{BUS}$) (i.e., the rising side of the sinusoidal oscillation) and to decrease from the voltage at the system bus 317 ($V_{BUS}$) to zero volts (i.e., the falling side of the sinusoidal oscillation). The controller 340 then provides the sync signal to the gate driver 345 for driving the switching element 335 and generating heat within the cooking vessel 330.

By determining the resonant frequency, operation of the switching element 335 can be controlled using a zero voltage switching (ZVS) technique. In this manner, the gate driver 345 can initiate gate pulses, including the sync signal, in accordance with such control technique (e.g., at a zero crossing event). The gate pulses can be delivered to and cause the switching element 335 to "turn-on" or "turn-off" causing the switching element 335 to conduct current. According to example embodiments of the present disclosure, operation of the switching element 335 can be controlled using ZVS. In a practical sense, ZVS can refer to switching transitions occurring at a voltage of value less than 1% of the absolute value of peak voltage across the switch. For example, if the peak is 1200 V, then switching transition at the switch voltage (Vsw) within the range −12 V<Vsw<+12 V can be considered ZVS. The gate pulses can cause the switching element 335 to "turn-on," with such practical ZVS causing the switching element 335 to conduct current with reduction in both switching losses and EMI. The length of the gate pulse controlling the "turn-off" time of switching element 335 is based at least in part on the resonant frequency feedback circuit 350.

Figure 4:
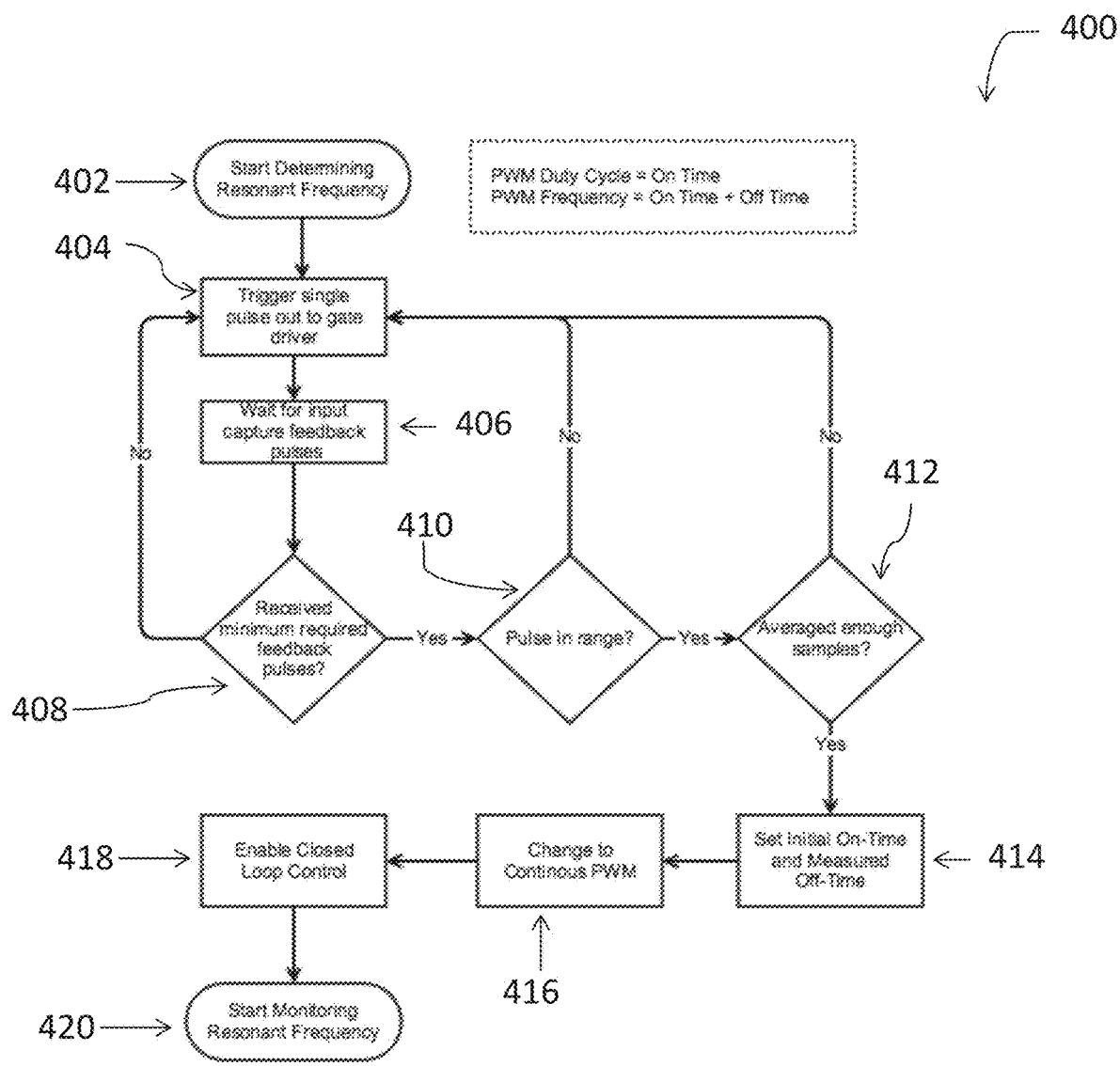
FIG. 4 depicts a flow diagram of a portion of an example method of operating an induction cooking system based, at least in part, on resonant frequency determination according to an example embodiment of the present disclosure.
Figure 5:
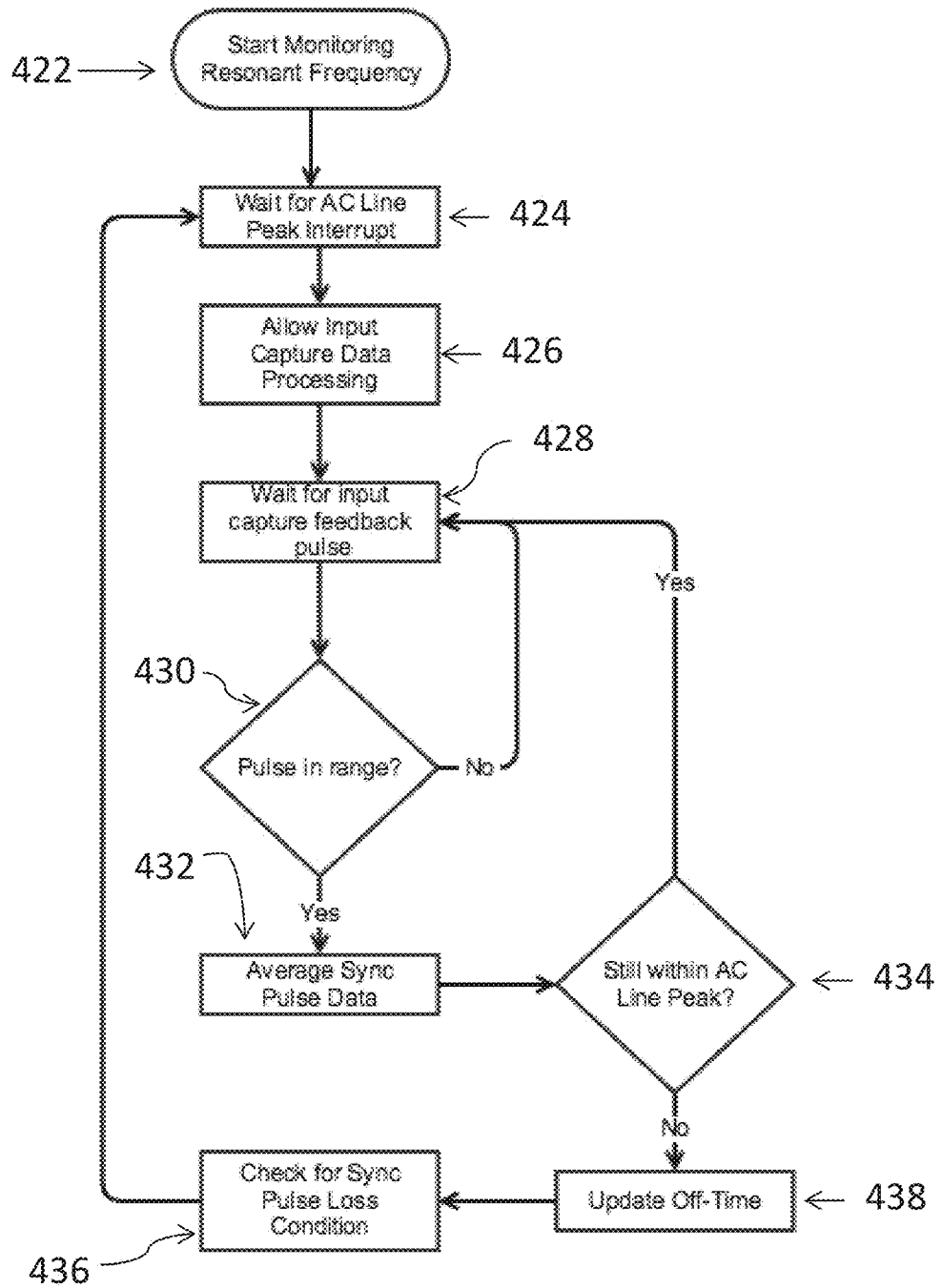
FIG. 5 depicts a flow diagram of a portion of an example method of operating an induction cooking system based, at least in part, on resonant frequency determination, which is a continuation of the method that is depicted in FIG. 4, according to an example embodiment of the present disclosure.

FIG. 4 depicts a flow chart of a portion of an example method 400 of controlling an induction cooking system 300 according to an example embodiment of the present disclosure. Method 400 can be performed by one or more controllers, such as controller 340, and by the other devices included with an induction cooking system, such as induction cooking system 300. Method 400 can include a startup algorithm (depicted in FIG. 4) to determine the resonant frequency of the tank circuit 319 and a monitoring algorithm (depicted in FIG. 5) to monitor the resonant frequency of the tank circuit 319 during the cooking cycle of induction cooking system 300. FIGS. 4 and 5 depict steps of method 400 performed in a particular order for purposes of illustration and discussion. Those of ordinary skill in the art, using the disclosure provided herein, will understand that the method discussed herein can be adapted, rearranged, expanded, omitted, performed simultaneously, or modified in various ways without deviating from the scope of the present disclosure.

At (402) the method can include initiating the determination of the resonant frequency of the tank circuit 319 upon the user startup of the induction cooking system 300. Startup of the induction cooking system 300 occurs in response to a user input indicating a desire to operate the induction cooking system 300. The user input can be provided through a user interface, such as user interface 30 (FIG. 1).

During startup of the induction cooking system 300, when the switching element 335 is not continually being turned on and off, the voltage of the system bus 317 ($V_{BUS}$) is a voltage that is equivalent or nearly equivalent to the peak value of the voltage provided by power supply 310. This startup condition will allow for the determination of the resonant frequency of the tank circuit 319 at the startup of the induction cooking system 300 at any time during the AC cycle of the power supply 310 provided that the tank circuit 319 is permitted to fully or almost fully discharge.

At (404) the method can include a controller, such as controller 340, triggering a single pulse out to a gate driver, such as gate driver 345, to commence initial determination of the resonant frequency of the tank circuit 319. Initial determination of the resonant frequency is commenced by the generation of a single startup pulse at (404) by the controller 340 of a duration that is long enough to excite the tank circuit 319 and provide accurate feedback to the controller 340 from the resonant frequency feedback circuit 350. For example, the duration of the single startup pulse generated by the controller 340 can be 10 μs for an 1800 W induction coil and 14 μs for a 2500 W induction coil. The duration of the startup pulse is set as the duty cycle of the gate driver 345 (i.e., the on-time for the switching element 335) at (414) once startup is complete. The startup pulse time can be increased if the $V_{CE}$ voltage 355 is not large enough to reach zero voltage switching.

At (406) the method includes waiting for control device 340 to capture feedback pulses from the resonant frequency feedback circuits 350. The wait time at (406) is the time required for the control device 340 to receive a number of feedback pulses from the resonant frequency feedback circuits 350 to filter out noise. For example, the wait time at (406) can be based on the time required for control device 340 to capture at least three (3) feedback pulses from the resonant frequency feedback circuit 350 at (408).

At (408) the method includes determining whether controller 340 has received a minimum number of feedback pulses from the resonant frequency feedback circuit 350. At (408), for each startup pulse generated by the controller 340 that triggers the gate driver 345 at (404), the controller 340 must receive a certain number of feedback pulses from the resonant frequency feedback circuit 350. The number of feedback pulses received must be within a minimum threshold and a maximum threshold. For example, the minimum threshold can be three (3) feedback pulses and the maximum threshold can be thirty (30) feedback pulses. If the number of feedback pulses exceed the maximum threshold amount, this condition is indicative of the absence of a cooking vessel 330. If a cooking vessel 330 is absent, the control device 340 can perform operations in response to this condition, such as providing an audible or visual indication of the absence of a cooking vessel 330 or disconnect power to the tank circuit 319. If the number of feedback pulses received at (408) is not within the boundaries established by the minimum threshold and the maximum threshold, the method returns to (404). If the number of feedback pulses received at (408) is within the boundaries established by the minimum threshold and the maximum threshold, the method proceeds to (410).

At (410) method includes determining whether each of the feedback pulses received at (408) is with one or more predetermined ranges. Each feedback pulse must be determined at (410) to be within the one or more predetermined ranges to be considered a valid feedback pulse. Each feedback pulse from the resonant frequency feedback circuit 350 which is captured by controller 340 in a range of time of between 5 μs and 25 μs after the startup pulse is generated by the control device 340 is considered as a valid voltage feedback pulse. The pulse width of each feedback pulse of the resonant frequency feedback circuit 350 must be within ten percent (10%) of the previously measured feedback pulse to be deemed valid. If the feedback pulses received at (410) are not within the boundaries established by the one or more predetermined ranges, the method returns to (404). If the feedback pulses received at (410) are within the boundaries established by the one or more predetermined ranges, the method proceeds to (412).

At (412) method includes determining the average pulse width (i.e., duty cycle) of the feedback pulses received at (410). Additionally, at (412) the method includes determining whether the number of valid feedback pulses received at (410) meets a predetermined minimum threshold from which a valid average feedback pulse width can be determined. For example, in some embodiments the predetermined threshold number of valid feedback pulses that must be received at (410) and used at (412) to determine an average feedback pulse width is three (3) pulses. If the number of feedback pulses considered in determining an average at (412) is at or above the predetermined threshold number, the method proceeds to (414). If the number of feedback pulses considered in determining an average feedback pulse at (412) is less than the predetermined threshold number, the method returns to (404).

At (414) method includes control device 340 setting initial control signals (setting an initial "turn-on" time and "turn-off" time) for the gate driver 345. The "turn-on" time is set to a predetermined value, based at least in part on one or more characteristics of the induction coil. For example, the duration of the "turn-on" time generated by the controller 340 and communicated to the gate driver can be 10 μs for an 1800 W induction coil and 14 μs for a 2500 W induction coil. The "turn-off" time of the gate driver 345 is based, at least in part, upon the average pulse width of the feedback pulses determined at (412) and the transfer function that is applied to the average pulse width by controller 340. The transfer function applied by controller 340 is based upon the amount of time required for the pulse generated by the circuit 350, which is a sinusoidal pulse, to increase from zero voltage to the voltage at the system bus 317 ($V_{BUS}$) (i.e., the rising side of the sinusoidal pulse) and to decrease from the voltage at the system bus 317 ($V_{BUS}$) to zero voltage (i.e., the falling side of the sinusoidal pulse).

At (416) method includes control device 340 entering continuous mode whereby it operates the gate driver 345 based on the "turn-on" and "turn-off" times set at (414) and system 300 begins to deliver power to the cooking vessel 330.

At (418) method includes controller 340 entering closed loop control mode to continually monitor the resonant frequency of the tank circuit 319 for maintaining zero voltage or near zero voltage switching during operation if the induction cooking system 300 (e.g., throughout the cooking cycle). In closed loop control, the controller 340 continually regulates the "off-time" of the switching element 335 based on the resonant frequency feedback circuit 350. In closed loop control, the controller 340 continually regulates the on-time based upon current feedback as measured at the shunt 360. If the cooking vessel 330 is lifted, shifted or removed, this can change the resonant frequency characteristics of the tank circuit 319. As such the resonant frequency is monitored and adjusted during a cooking cycle.

At (420) method proceeds to (422) of FIG. 5. At (422) method includes beginning to monitor the resonant frequency of the tank circuit 319 during operation if the induction cooking system 300 (e.g., during the cooking cycle).

At (424) the method includes controller 340 waiting for AC line peak interrupt. During the cooking cycle, the switching element 335 is continually turned on and off and the voltage at the system bus 317 ($V_{BUS}$) is equivalent to the collector-emitter junction voltage ($V_{CE}$) 355. As such, resonant frequency can only be measured at or near the peak voltage of the AC line (i.e., the peak collector-emitter junction voltage), which will be the peak of the sinusoidal pulse. For example, the peak of the AC line voltage (i.e., the peak voltage of the sinusoidal pulse) can be approximately 4 milliseconds after the zero cross of the line voltage at a 120 Hz line frequency. At other times the pulse generated by the resonant frequency feedback circuit 350 (i.e., a comparator circuit) is not an accurate reflection of the resonant frequency of the tank circuit 319. When AC line peak interrupt is detected the method proceeds to (426).

At (426) the method includes commencing the measurement or capture of data, such as data based on feedback pulses, for processing by one or more controllers. At (426) the method can include a controller, such as controller 340, measuring or capturing feedback pulses from the resonant frequency feedback circuit 350. The feedback pulses can be measured at or near the peak voltage of the AC line (i.e., the peak voltage of the sinusoidal power supply voltage). As used herein, "AC line" voltage refers to the voltage being supplied from the power supply via the system bus (i.e., $V_{BUS}$). The AC line input is full wave rectified. The peak of the AC line voltage can be determined using a peripheral timer, which is started in the zero cross of the AC line interrupt. The zero cross interrupt occurs every time the AC line voltage changes from positive to negative. For instance, when considering an AC line input voltage that has a frequency of 60 Hz, a zero cross interrupt would occur at or near every 8.3 milliseconds. The peripheral timer can provide a signal to the controller to perform operations, including measuring the AC line voltage at a predetermined time. This predetermined start time can be based, at least in part, on the frequency of the AC line voltage. For example, when the AC line input voltage has a frequency of 60 Hz, 3 milliseconds after the peripheral timer is started the peripheral timer can provide a signal to a controller which notifies the controller, or another component of the induction cooking system, to begin measuring or sampling the voltage of the feedback sync pulses for a predetermined period of time. This predetermined period of time for measurement or sampling can be based, at least in part, on the frequency of the sinusoidal AC line input. For example, when the AC line input voltage has a frequency of 60 Hz as discussed above, 5 milliseconds after the peripheral timer is started, the peripheral timer can provide a signal to a controller which notifies the controller, or another component of the induction cooking system, to stop measuring or sampling the pulse width of the feedback pulses. During the 2 millisecond window at the peak of the AC line voltage, sync pulse values (i.e. the pulse width) can be measured or captured. At (426) the method includes setting a flag that is indicative of the commencement of the processing of the data captured at (428). The flag can be set and cleared once per $V_{BUS}$/AC line cycle. When the AC line input voltage has a frequency of 60 Hz as discussed above, every AC line cycle is 8.3 milliseconds.

At (428) the method includes waiting for control device 340 to capture feedback pulses from the resonant frequency feedback circuit 350. At (428) the controller captures sync pulse data for the duration of the predetermined period of time for measurement or sampling (i.e., the 2 millisecond window). At (428) the number of pulses captured or measured in the predetermined period of time for measurement or sampling (i.e., the 2 millisecond window) is based upon the resonant frequency of the tank circuit, so long as at least a predetermined threshold number of pulses are captured. For example, if the AC line frequency is 60 Hz and the resonant tank is operating at 20 KHz, roughly 83 pulses will be captured (20 KHz/120 Hz [full wave rectified 60 Hz AC Line input]=166 pulses, in 2 ms=40 pulses). A predetermined threshold number of pulses that must be captured to filter out noise. In some embodiments, the predetermined threshold number of pulses that must be captured can be three pulses. If the minimum number of pulses is not captured, this indicates a fault condition within the tank circuit.

At (430) method includes determining whether each of the feedback pulses received at (428) is within one or more predetermined ranges. Each feedback pulse must be within the one or more predetermined ranges to be considered a valid feedback pulse. The one or more predetermined ranges can relate to, at least one of, pulse width, time and voltage. For example, each pulse received at (428) and which is captured by a controller, such as controller 340, and has a pulse width in a range of between 5 µs and 25 µs is considered as a valid voltage feedback pulse. If the feedback pulses are not within the boundaries established by the one or more predetermined ranges, the method returns to (428). If the feedback pulses received at (428) are within the boundaries established by the one or more predetermined ranges, the method proceeds to (432).

At (432) method includes determining an average sync pulse value which are based upon the sync pulses measured or captured at (428) and based upon the feedback pulses determined to be in range at (430).

At (434) method includes determining whether feedback pulses and sync pulses can still be captured based, at least in part, on a flag set at (426) indicating that controller can proceed with operations including data processing. At (434) method includes determining whether feedback pulses and sync pulses can still be captured based, at least in part, the AC line peak voltage. If the sync pulses can still be captured at (428) (i.e., predetermined period of time for measurement or sampling set at (426) are still open) the captured pulse can still be used at (432) to determine an average sync pulse (i.e., the sync pulses were measured or captured from valid feedback pulses) and the method returns to (428). For example, when the AC line input voltage has a frequency of 60 Hz, the predetermined period of time for measurement or sampling set at (426) is between 3 milliseconds and 5 milliseconds after the peripheral timer is started. If sync pulses can be captured in the time period for measurement or sampling (i.e., the 2 millisecond window) the captured pulse can still be used at (432) to determine an average sync pulse (i.e., the sync pulses were measured or captured from valid feedback pulses) and the method returns to (428). If the sync pulses are not within the AC line peak or the predetermined period of time for measurement and sampling, the sync pulses cannot be used at (432) to determine an average sync pulse and the method continues to (438).

At (438) method includes controller 340 changing the "turn-off" time (i.e., the sync pulse) of the gate driver 345 is based, at least in part, upon the average sync pulse value determined at (432). For example, the "turn-off" time will change when a cooking vessel is removed from or moved on a cook-top. At (438) the "turn-off" time can be updated at one or more zero cross events (i.e., when $V_{BUS}$=0V). In some embodiments, updating the "turn-off" time at each zero cross event can result in an update of the "turn-off" time occurring in intervals at or near 8.3 milliseconds. Updating the "turn-off" time based on each zero cross event can reduce the likelihood that damage may occur to the switching elements in the event that a cooking vessel is removed from the cooktop. This is because it will take a user longer than the time that occurs between zero cross events (i.e., which can be 8.3 milliseconds in some embodiments) to remove a cooking vessel from a cooktop and at method (438) the "turn-off" time will be updated before such removal is completed by a user. The "turn-off" time is adjusted as part of the continuous driving PWM to allow for smooth transitions when the cooking vessel is moved or removed. Additionally, adjusting the driving PWM at the lowest point in the AC Line input can reduce noise.

At (436) method includes controller, such as controller 340, determining whether a sync pulse loss condition exists and then the method returns to (424). In this manner, the method can include a continuous monitoring of the resonant frequency of the tank circuit 319 and adjust the "off-time" of the switching element 335 based on the resonant frequency. A sync pulse loss condition (i.e., a condition when the sync pulses will not be received by the controller) can exist in the event of hardware failure or if noise is present in the feedback pulse or in the other electrical signals in induction heating system. Determining an average sync pulse at (432) can reduce variation in the sync pulse, but in the event that the induction heating system or circuits associated with the induction heating system have been damaged, the hardware failure will manifest as a loss of feedback pulse at (436). For example, at (426) the one or more controllers would receive either no feedback pulse or the pulse will be outside of the allowed 5 us to 25 us range at (430) and a sync pulse loss condition will be determined at (436).

Figure 6:
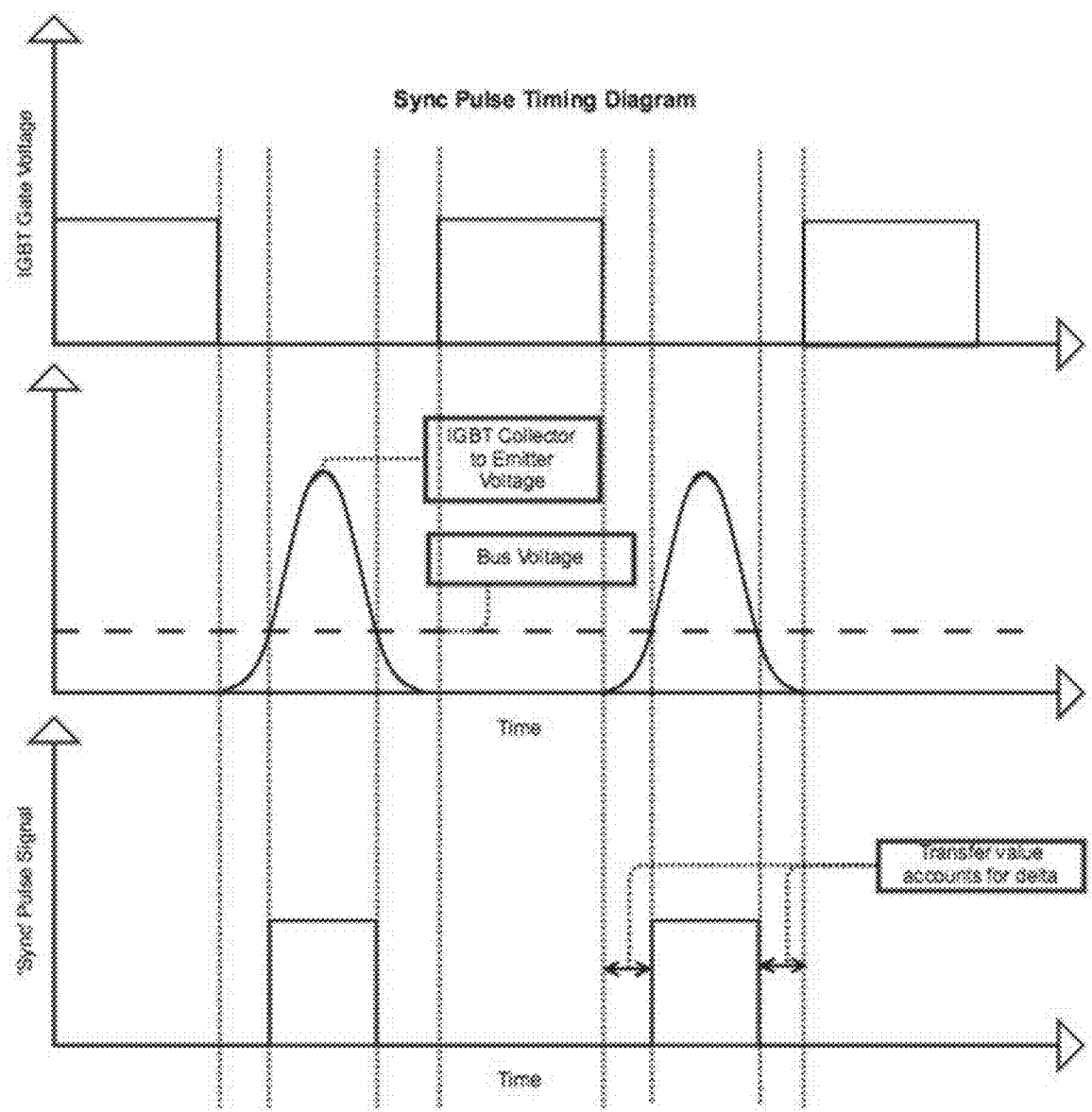
FIG. 6 is a graphical depiction of the relationship of the switching element voltage, feedback pulse from the resonant frequency feedback circuit, the sync pulse and transfer value.

FIG. 6 is a graphical depiction of the relationship of the switching element voltage, feedback pulse from the resonant frequency feedback circuit, the sync pulse and transfer value.

Although specific features of various embodiments may be shown in some drawings and not in others, this is for convenience only. In accordance with the principles of the present disclosure, any feature of a drawing can be referenced and/or claimed in combination with any feature of any other drawing.

This written description uses examples for the disclosure, including the best mode, and also to enable any person skilled in the art to practice the disclosure, including making and using any devices or systems and performing any incorporated methods. The patentable scope of the disclosure is defined by the claims, and can include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for determining a resonant frequency of a quasi-resonant inverter in an induction cooking device, wherein the quasi-resonant inverter includes a parallel configuration of an inductor, a capacitor, a cooking vessel, a switching element and a resonant frequency feedback circuit, the method comprising:
   generating, by one or more controllers, a startup pulse;
   receiving, by one or more controllers, multiple feedback pulses from a resonant frequency feedback circuit;
   measuring a pulse width of each of the feedback pulses;
   determining whether each of the feedback pulses has a pulse width in a range between 5 μs and 25 μs;
   calculating a sync pulse width based at least in part on the feedback pulses that have a pulse width in the range between 5 μs and 25 μs; and
   determining the resonant frequency based at least in part on the sync pulse width and a transfer function.

2. The method of claim 1, wherein the feedback pulses are based, at least in part, on a voltage across a collector-emitter junction of the switching element.

3. The method of claim 1, wherein the resonant frequency feedback circuit is a voltage comparator.

4. The method of claim 1, wherein the switching element is an insulated gate bipolar transistor.

5. The method of claim 1, wherein the method further comprises determining if a number of the feedback pulses received, by the one or more controllers, is within a first predetermined range.

6. The method of claim 1, wherein the method further comprises determining if the pulse width of feedback pulses received, by the one or more controllers, is within a second predetermined range.

7. The method of claim 1, wherein the transfer function is based upon the amount of time required for each feedback pulse generated by the comparator circuit to increase from zero volts to the voltage at the system bus ($V_{BUS}$) and to decrease from the voltage at the system bus ($V_{BUS}$) to zero volts.

* * * * *